United States Patent
Zhang (10) Patent No.: US 12,302,525 B2
(45) Date of Patent: May 13, 2025

(54) SERVER ASSEMBLY (71) Applicants: SQ TECHNOLOGY (SHANGHAI) CORPORATION, Shanghai (CN); INVENTEC CORPORATION, Taipei (TW)

(72) Inventor: Shuai Zhang, Shanghai (CN)

(73) Assignees: SQ TECHNOLOGY (SHANGHAI) CORPORATION, Shanghai (CN); INVENTEC CORPORATION, Taipei (TW)

(*) Notice: Subject to any disclaimer, the term of this patent is extended or adjusted under 35 U.S.C. 154(b) by 200 days.

(21) Appl. No.: 18/301,269

(22) Filed: Apr. 17, 2023

(65) Prior Publication Data
US 2024/0306340 A1 Sep. 12, 2024

(30) Foreign Application Priority Data
Mar. 7, 2023 (CN) .......................... 202310225294.7

(51) Int. Cl.
*H05K 7/14* (2006.01)
(52) U.S. Cl.
CPC .................................. *H05K 7/1489* (2013.01)
(58) Field of Classification Search
None
See application file for complete search history.

(56) References Cited

U.S. PATENT DOCUMENTS

| | | | |
|---|---|---|---|
| 10,317,949 B1 * | 6/2019 | Lin | H05K 5/023 |
| 10,485,123 B1 * | 11/2019 | Lin | H05K 5/0221 |
| 10,607,658 B1 * | 3/2020 | Qian | G11B 33/022 |
| 2005/0111178 A1 * | 5/2005 | Bradley | H05K 7/1411 360/99.06 |
| 2011/0103001 A1 * | 5/2011 | Chen | G11B 33/128 361/679.39 |
| 2012/0320521 A1 * | 12/2012 | Gong | G06F 1/187 361/679.38 |
| 2021/0259120 A1 * | 8/2021 | Lin | G06F 1/181 |

* cited by examiner

Primary Examiner — James Wu
Assistant Examiner — Christopher L Augustin (57) ABSTRACT A server includes a computer case including a front window, a GPU assembly mounted in the computer case and including a module bracket, and a locking assembly comprising a latching member. An end of the GPU assembly is located at the front window. The latching member is rotatably mounted at the front window and capable of switching between an unlocking state and a locking state, the module bracket is provided with a locking member corresponding to the latching member. In the locking state the latching member is at least partially inserted into the locking member to limit the GPU assembly in the computer case, and in the unlocking state, the latching member is disengaged from the locking member.

9 Claims, 11 Drawing Sheets

SERVER ASSEMBLY

CROSS-REFERENCE TO RELATED APPLICATIONS

This application claims priority of Chinese Patent Application No. 2023102252947, filed on Mar. 7, 2023, the content of which is hereby incorporated by reference in its entirety.

TECHNICAL FIELD

The present disclosure relates to the technical field of mounting a GPU (Graphics Processing Unit) in a server, in particular to a server.

BACKGROUND

With the development of the information technology field, the maintenance of the server becomes more and more important. A GPU assembly is an important and costly component in a server, and the disassembly of GPU assembly is particularly important during the maintenance of the server. The GPU assembly is mounted in a computer case. The GPU assembly needs to be disassembled from the computer case when maintaining the server, and the maintained GPU assembly needs to be mounted and fastened to the computer case. With the development of technology, the server having a front outlet mode is widely used, which requires the GPU assembly to be configured at a front window of the computer case. The front window is provided holes for cables to extend through, a part of the front window that can be assembled other elements is reduced. The server cannot simultaneously meet the requirements of the GPU assembly can be firmly assembled at the front window and can be quickly disassembled and assembled during the maintenance of the server.

SUMMARY

According to some embodiments of the present disclosure, a server is provided.

A server includes a computer case including a front window, a GPU assembly mounted in the computer case and including a module bracket, and a locking assembly comprising a latching member. An end of the GPU assembly is located at the front window. The latching member is rotatably mounted at the front window and capable of switching between an unlocking state and a locking state, the module bracket is provided with a locking member corresponding to the latching member. In the locking state the latching member is at least partially inserted into the locking member to limit the GPU assembly in the computer case, and in the unlocking state, the latching member is disengaged from the locking member.

Details of one or more embodiments of the present disclosure are set forth in the following drawings and descriptions. Other objects, purposes and advantages will become apparent upon review of the following specification, drawings and claims.

BRIEF DESCRIPTION OF THE DRAWINGS

The drawings constitute a part of the present disclosure and are used to provide a further understanding of the present disclosure. The exemplary embodiments of the present disclosure and their descriptions are used to explain the present disclosure and do not constitute an improper limitation of the present disclosure.

In order to more clearly explain the embodiments of the present disclosure or the technical solutions in the related art, the accompanying drawings that need to be used in the description of the embodiments or the related art will be briefly described below. It is clear that the drawings in the following description are only the embodiments of the present disclosure. For those skilled in the art, other drawings can be obtained according to the disclosed drawings without paying creative labor.

DESCRIPTION OF REFERENCE NUMERALS 10. server; 11. computer case; 112. front window; 113. front window frame; 12. GPU assembly; 122, module bracket; 1221, locking member; 123. decorative plate; 13. locking assembly; 131, latching member; 1311, locking post; 132. assembly base; 1321. mounting gap; 1322, anti-sliding member; 133, sliding bracket; 1331, sliding limiting portion; 1332, guiding groove; 1333, operation portion; 1334, anti-sliding texture; 1335, anti-sliding groove; 134, pin; 14, corner locking member.

DETAILED DESCRIPTION OF THE EMBODIMENTS

In order to make the above objects, features and advantages of the present application more obvious and easier to understand, the specific embodiments of the present application are described in detail below in combination with the accompanying drawings. Many specific details are set forth in the following description to facilitate a full understanding of the invention. However, the present application can be implemented in many ways different from those described herein, and those skilled in the art can make similar improvements without violating the connotation of the invention. Therefore, the invention is not limited by the specific embodiments disclosed below.

In the description of the present application, it should be understood that the terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential direction" are based on the azimuth or position relationship shown in the attached drawings, which is only for the convenience of describing the present application and simplifying the description, rather than indicating or implying that the device or element must have a specific azimuth, be constructed and operated in a specific azimuth, so it cannot be understood as a limitation of the present application.

In addition, the terms "first" and "second" are only used for descriptive purposes and cannot be understood as indicating or implying relative importance or implicitly indicating the number of indicated technical features. Thus, the features defined with "first" and "second" may explicitly or implicitly include at least one of the features. In the description of the present application, "multiple" means at least two, such as two, three, etc., unless otherwise expressly and specifically defined.

In the present invention, unless otherwise expressly specified and limited, the terms "mount", "connect", "contact", "fix" and other terms should be understood in a broad sense, for example, they can be fixed connections, removable connections, or integrated. It can be mechanical connection or electrical connection. It can be directly connected or indirectly connected through an intermediate medium. It can be the connection within two elements or the interaction relationship between two elements, unless otherwise expressly limited. For those skilled in the art, the specific meaning of the above terms in the present application can be understood according to the specific situation.

In the present invention, unless otherwise expressly specified and limited, the first feature "above" or "below" the second feature may be in direct contact with the first and second features, or the first and second features may be in indirect contact through an intermediate medium. Moreover, the first feature is "above" the second feature, but the first feature is directly above or diagonally above the second feature, or it only means that the horizontal height of the first feature is higher than the second feature. The first feature is "below" of the second feature, which can mean that the first feature is directly below or obliquely below the second feature, or simply that the horizontal height of the first feature is less than that of the second feature.

It should be noted that when an element is called "fixed to" or "provided on" another element, it can be directly on another element or there can be a centered element. When an element is considered to be "connected" to another element, it can be directly connected to another element or there may be intermediate elements at the same time. The terms "vertical", "horizontal", "up", "down", "left", "right" and similar expressions used herein are for the purpose of illustration only and do not represent the only embodiment.

Figure 1:
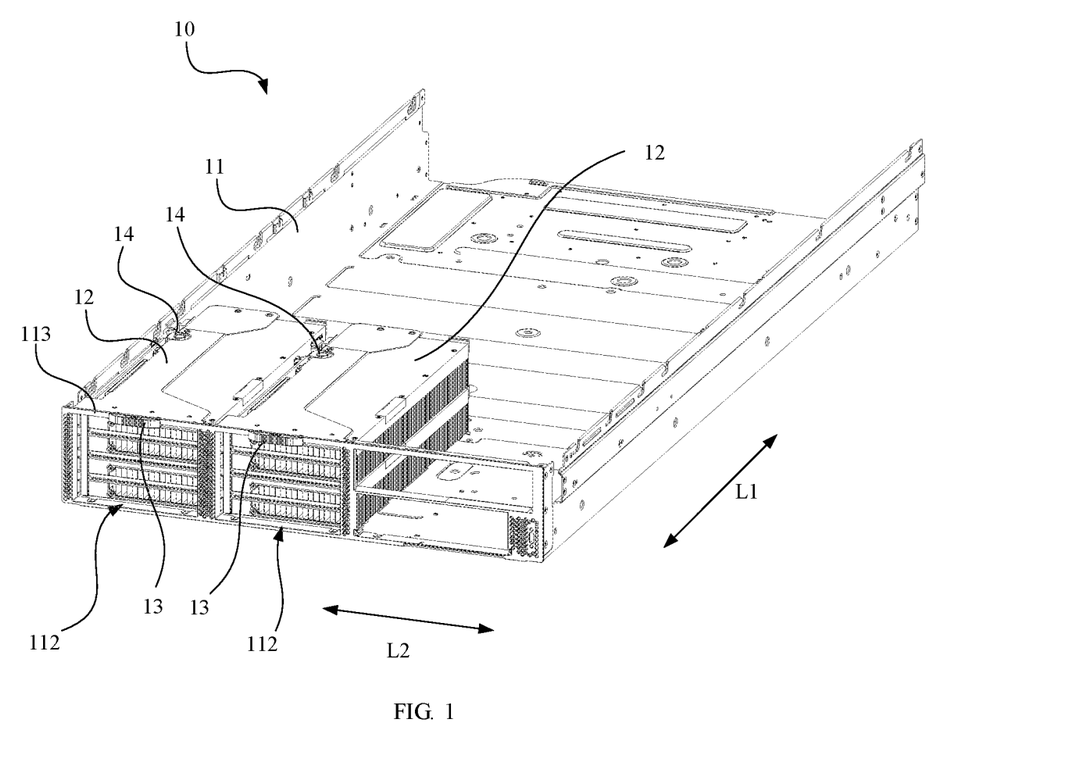
FIG. 1 is a perspective view of a server according to an embodiment.
Figure 2:
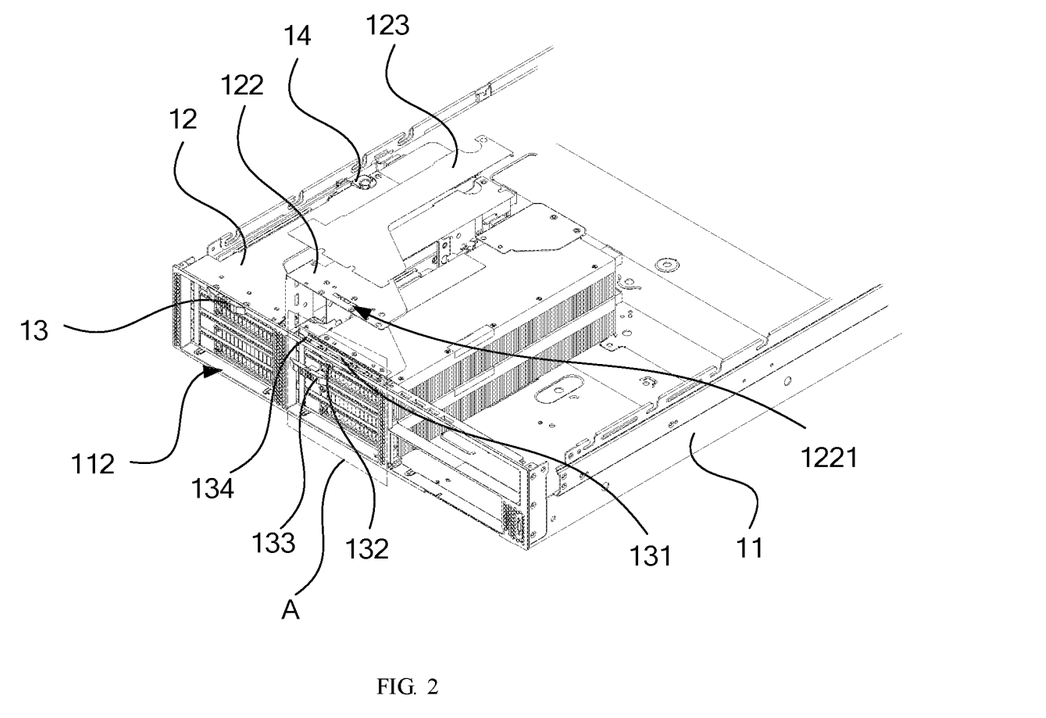
FIG. 2 is a partial exploded view of the server of FIG. 1.

As shown in FIG. 1 and FIG. 2, a server 10 is provided according to an embodiment of the present disclosure, which includes a computer case 11, a GPU assembly 12, and a locking assembly 13. The computer case 11 includes a front window 112. The GPU assembly 12 includes a module bracket 122. The GPU assembly 12 is mounted in the computer case 11, and an end of the GPU assembly 12 is located at the front window 112.

Figure 3:
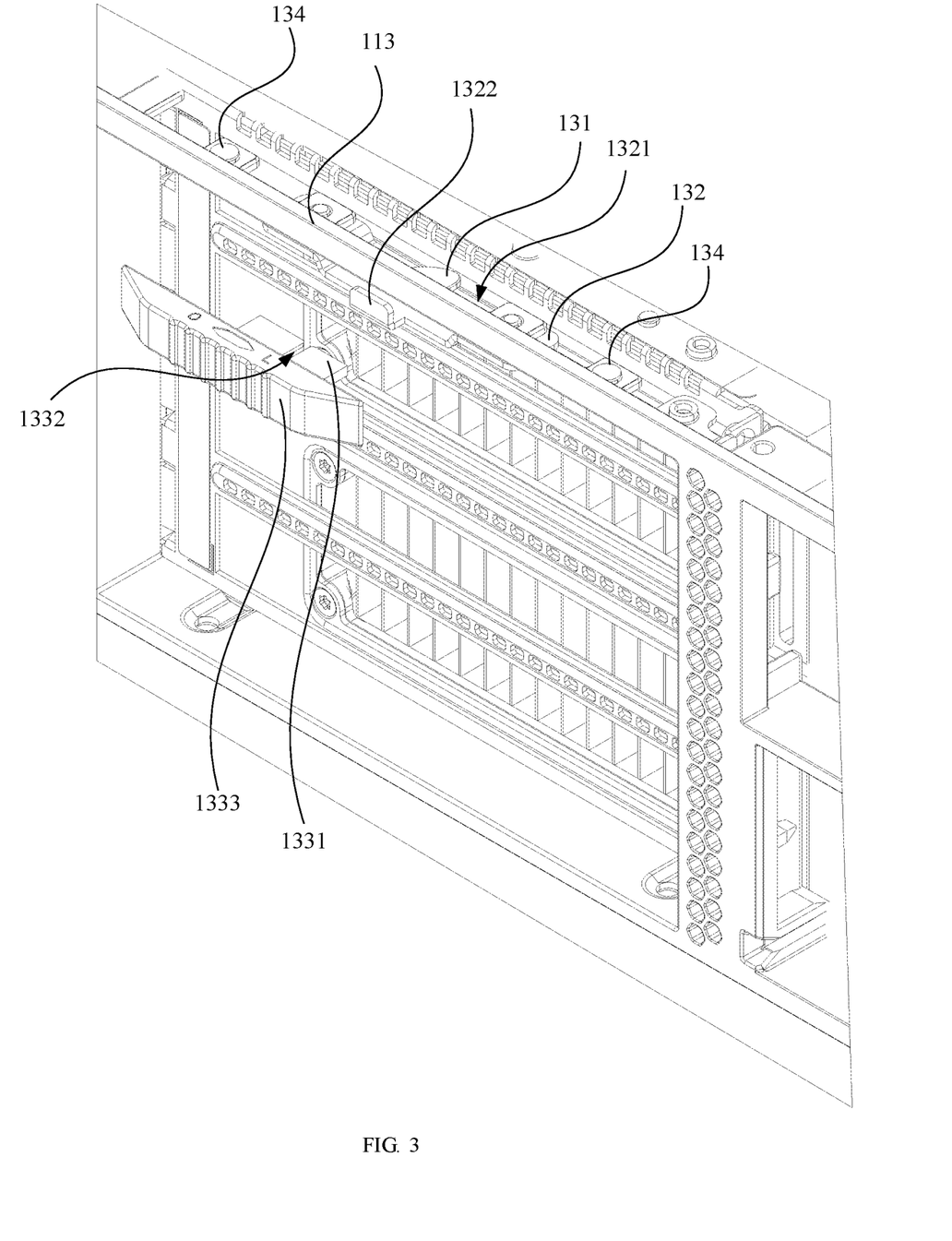
FIG. 3 is an enlarged view of part A in FIG. 2.
Figure 7:
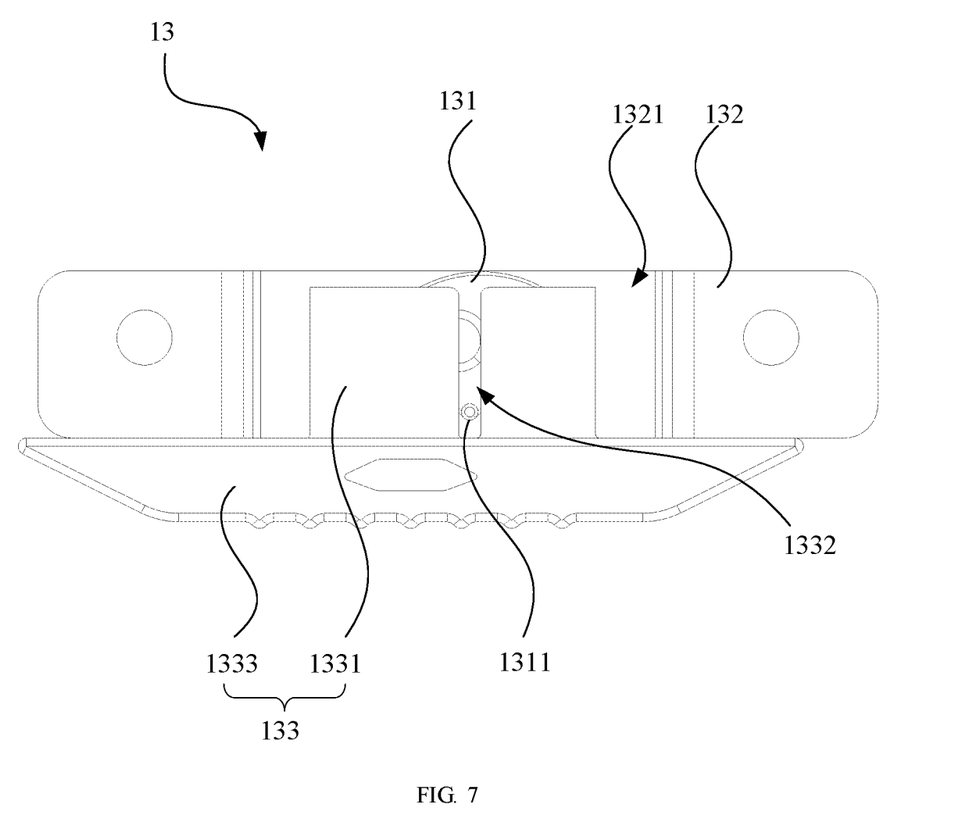
FIG. 7 is a top view of a locking assembly in an unlocking state according to an embodiment.
Figure 8:
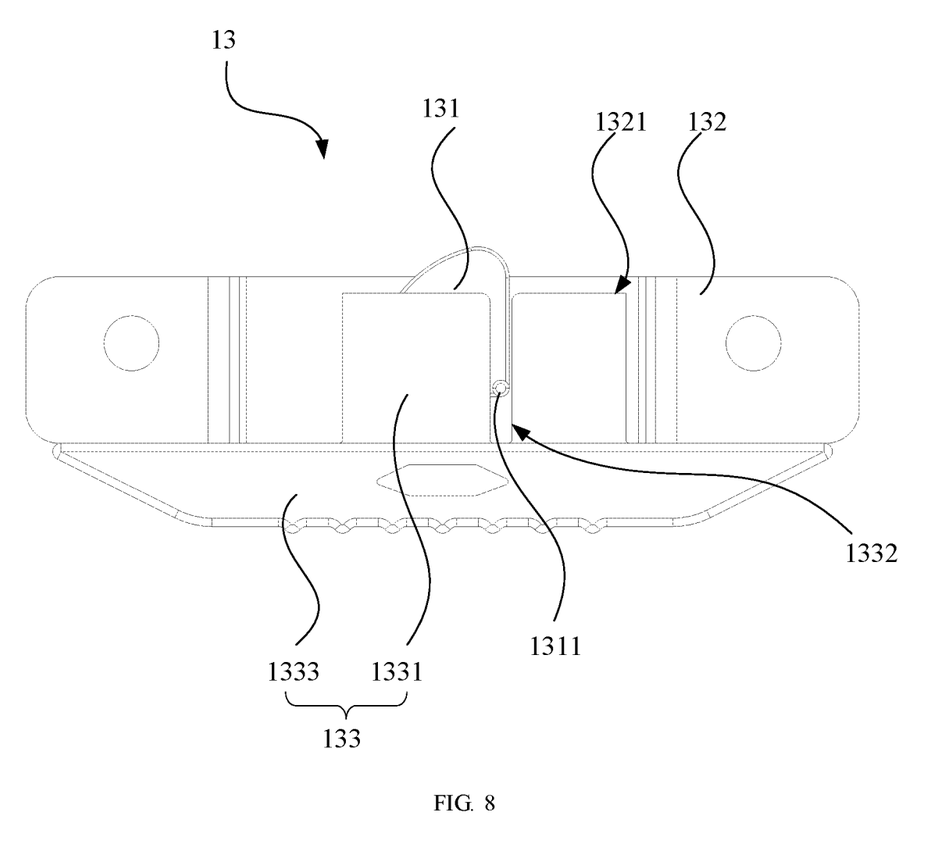
FIG. 8 is a top view of the locking assembly in a locking state according to an embodiment.
Figure 9:
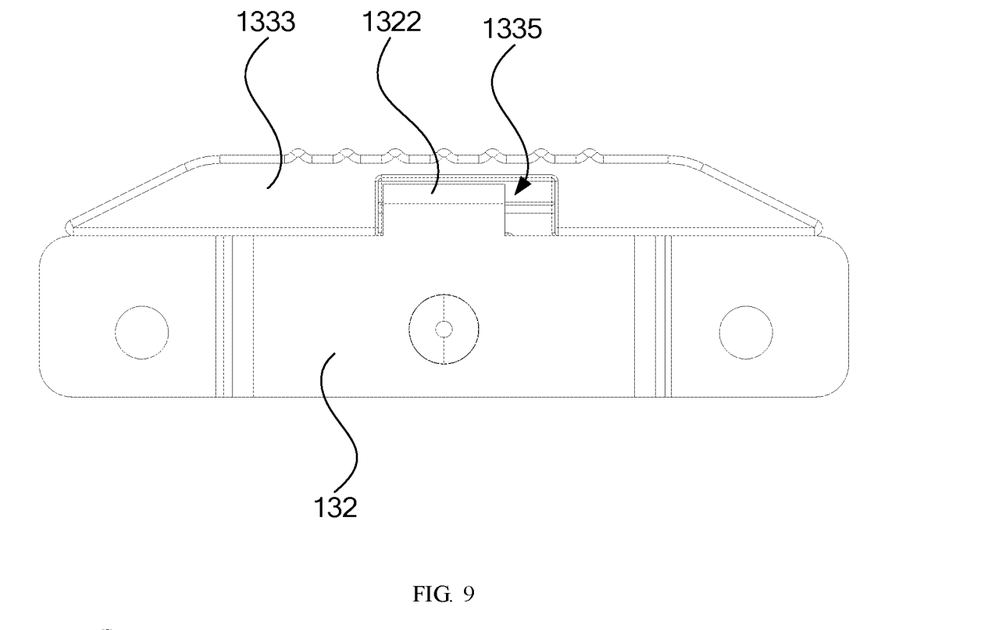
FIG. 9 is a bottom view of the locking assembly according to an embodiment.
Figure 10:
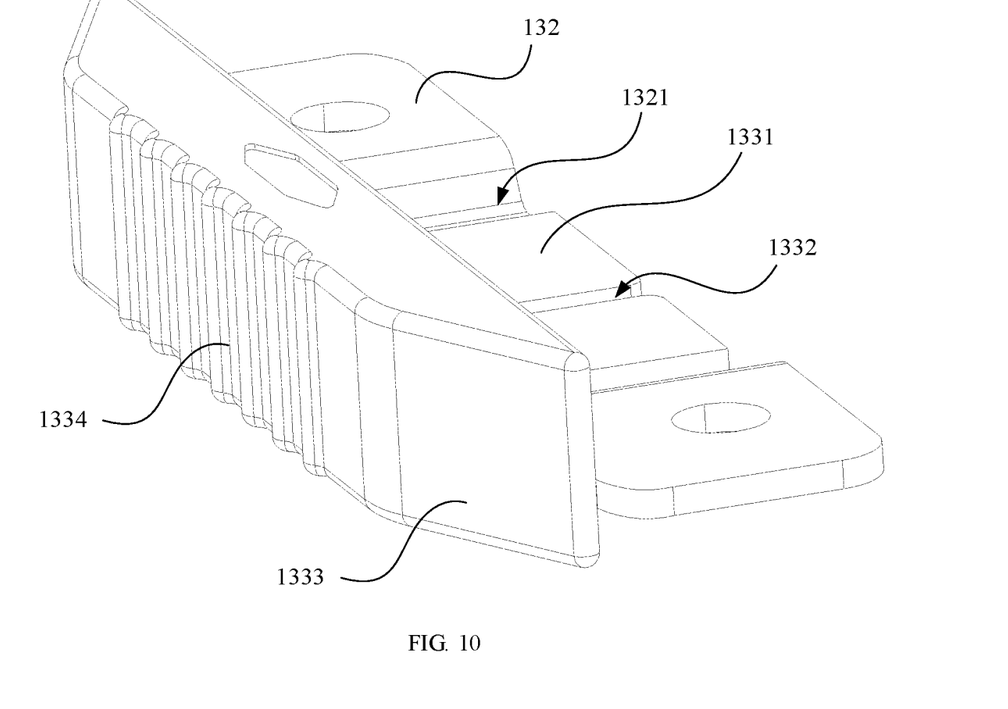
FIG. 10 is a perspective view of the locking assembly after removing a latching member.

As shown in FIG. 7 and FIG. 8, the locking assembly 13 includes a latching member 131 rotatably mounted at the front window 112, and the latching member 131 is capable of switching between an unlocking state and a locking state. As shown in FIG. 1 to FIG. 3, the module bracket 122 is provided with a locking member 1221 corresponding to the latching member 131. In the locking state, the latching member 131 is at least partially inserted into a slot between the locking member 1221 and the module bracket 122, so as to limit the GPU assembly 12 in the computer case 11, and in the unlocking state, the latching member 131 is disengaged from the locking member 1221.

In the aforementioned server 10, when the GPU assembly 12 is assembled in the computer case 11, the end of the GPU assembly 12 adjacent to the front window 112 is locked to the computer case 11 through the locking assembly 13, so as to ensure that the GPU assembly 12 can be firmly assembled at the front window 112. When the GPU assembly 12 is disassembled from the computer case 11, the latching member 131 is rotated to the unlocking state, so that the GPU assembly 12 can be disassembled from the computer case 11 conveniently and quickly.

As shown in FIG. 1, FIG. 2 and FIG. 7, when the latching member 131 is in unlocking state, the locking assembly 13 is disengaged from the locking member 1221. As shown in FIG. 1, FIG. 2 and FIG. 8, when the latching member 131 is rotated to the locking state, a length of the latching member 131 protruding from an inner side of the front window 112 is increased, and the latching member 131 is inserted into the locking member 1221, thereby limiting the movement of the GPU assembly 12 relative to the computer case 11.

Figure 4:
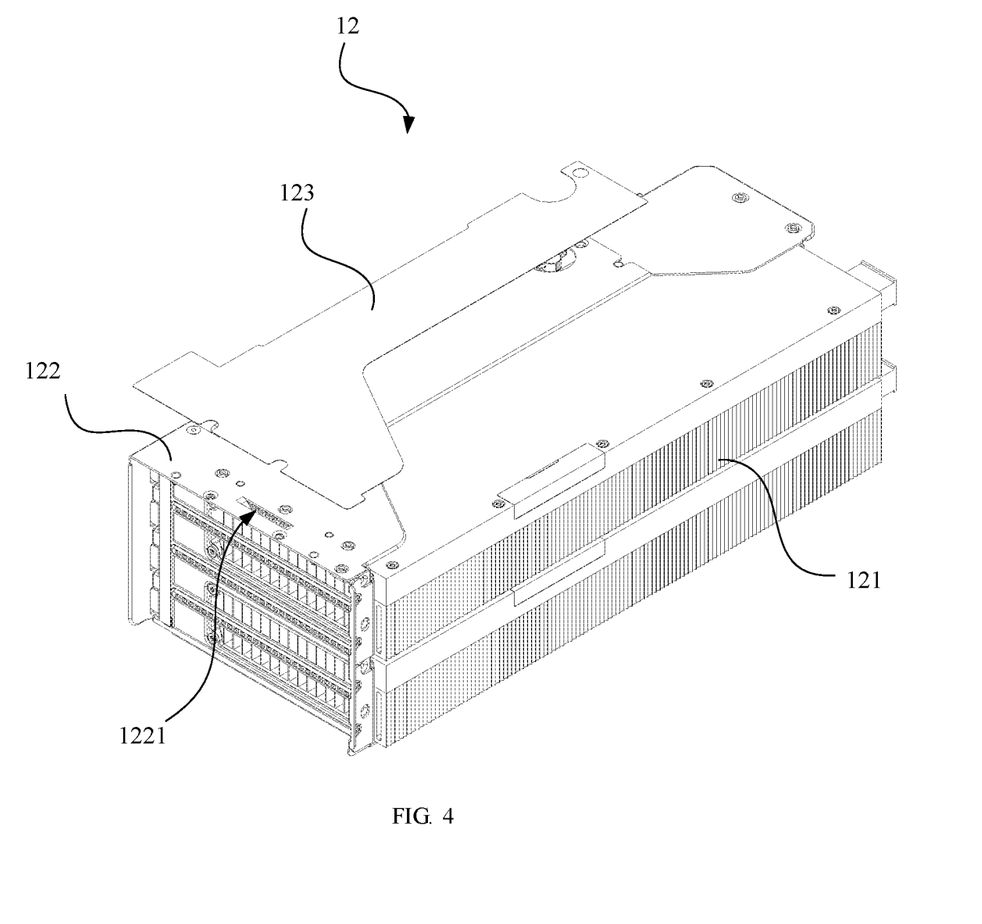
FIG. 4 is a partial exploded view of a GPU assembly of FIG. 1.
Figure 5:
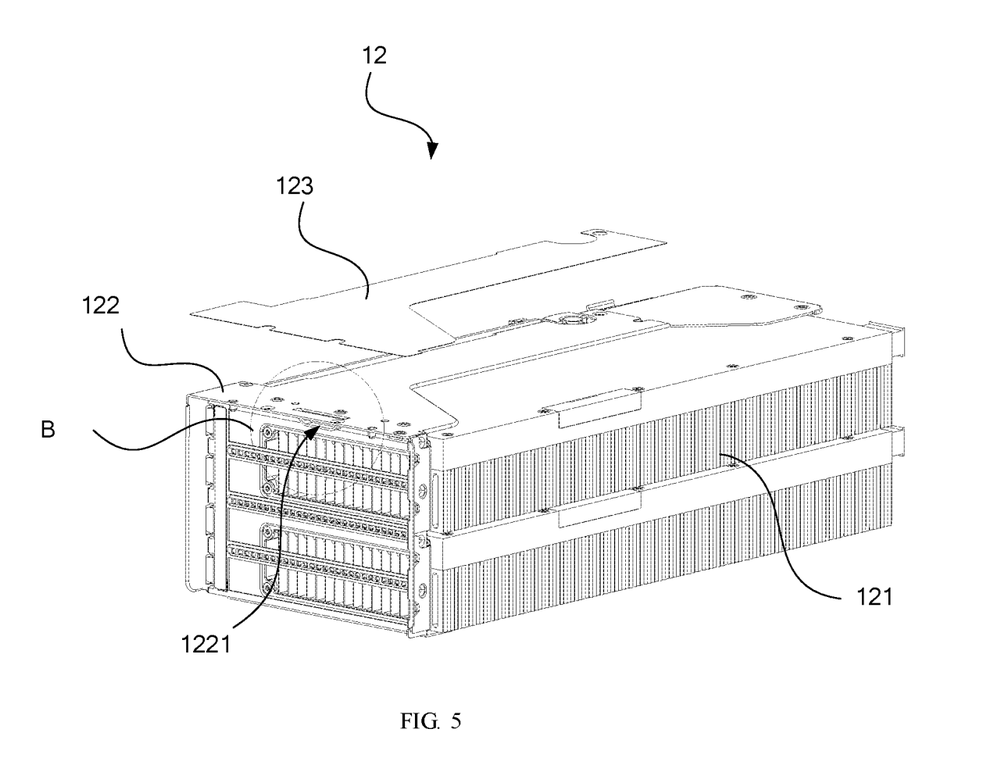
FIG. 5 is a partial exploded view of the GPU assembly of FIG. 1 viewed from another aspect.
Figure 6:
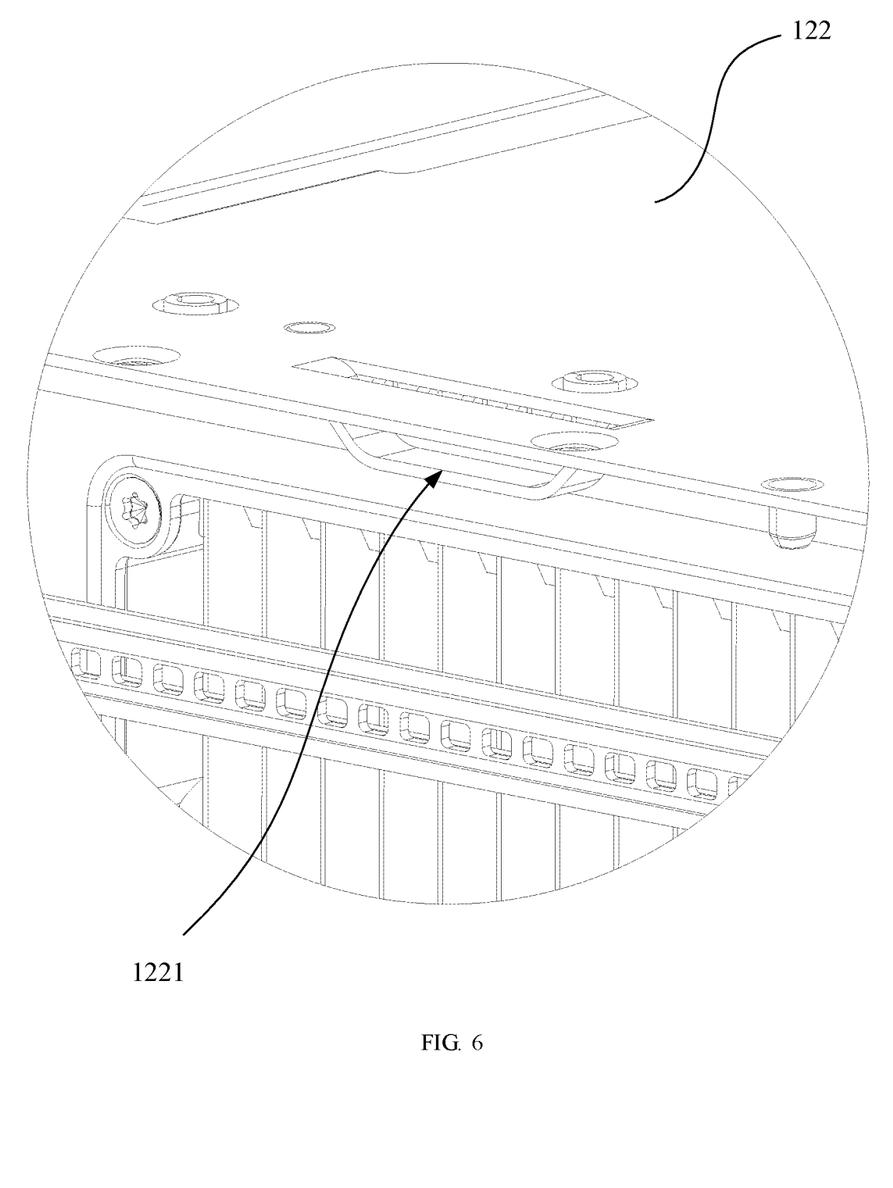
FIG. 6 is an enlarged view of part B in FIG. 5.

As shown in FIG. 4 to FIG. 6, in some embodiments, the locking member 1221 is formed by punching and bending a part of the module bracket 122. The latching member 131 inserted into the locking member 1221 cannot move relative to the module bracket 122 in any direction perpendicular to an insertion direction of the latching member 131, so as to limit the module bracket 122 in the computer case 11.

For example, in an embodiment, as shown in FIGS. 1 to 6, the insertion direction of the latching member 131 into the locking member 1221 is parallel to a front-rear direction of the computer case 11. As shown in FIG. 1 and FIG. 2, when the latching member 131 is inserted into the locking member 1221, the GPU assembly 12 cannot move in a left-right direction and an up-down direction relative to the computer case 11. In this embodiment, the front-rear direction is a direction indicated by an arrow L1 in FIG. 1. The orientations of front, back, up, down, left and right described in the embodiment are defined for illustrative purposes under the viewpoint shown in FIG. 1, and the orientations are not intended to limit only the specific orientation, construction and operation in the specific orientation, and therefore should not be construed as limiting the present disclosure. The orientations are correspondingly changed when the viewpoint changes.

Further, as shown in FIG. 1 to FIG. 3, the locking assembly 13 further includes a pin 134, and the computer case 11 includes a frame 113 forming the front window 12. A part of the module bracket 122 is in contact with the frame 113. The pin 134 is inserted into holes provided on the module bracket 122 and the frame 113 in a direction intersected with the front-rear direction of the computer case 11. The module bracket 122 cannot move in the front-rear direction relative to the computer case 11 under the limiting action of the pin 134, so that the GPU assembly 12 is fixed relative to the computer case 11.

During assembly, a part of the module bracket 122 is placed on the computer case 11 first, so that a hole on the computer case 11 for inserting the pin 134 is aligned with a hole on the module bracket 122 for inserting the pin 134, and then the pin 134 is inserted into the two holes successively. This process not only limits a movement of the module bracket 122 in the front-rear direction relative to the computer case 11, but also limit an initial position of the module bracket 122. When the module bracket 122 and the computer case 11 are initially positioned through the pin 134, the locking member 1221 is aligned with the latching member 131. At this time, the latching member 131 can be switched to the locking state by rotating the latching member 131.

Furthermore, in some embodiments, as shown in FIGS. 7 to 13, the locking assembly 13 further includes an assembly base 132. As shown in FIG. 1 to FIG. 3, the assembly base 132 is connected to the frame 113. Referring to FIG. 7 to FIG. 13, the latching member 131 is hinged to the assembly base 132, and the latching member 131 rotates relative to the computer case 11 when rotating relative to the assembly base 132. In an alternative embodiment, the latching member 131 may also be directly hinged to the computer case 11.

Specifically, as shown in FIG. 1 to FIG. 3, a part of the assembly base 132 is spaced apart from the frame 113 to form a mounting gap 1321 between the assembly base 132 and the frame 113. The latching member 131 is mounted in the mounting gap 1321, and the latching member 131 is capable of rotating in the mounting gap 1321 relative to the assembly base 132, so as to switch between the unlocking state and the locking state. The latching member 131 is protected in the mounting gap 1321, and the latching member 131 will not be prevented from rotating by other components.

As shown in FIGS. 1 to 3, 7 and 8, the latching member 131 is of a plate-shaped structure, a thickness direction of the mounting gap 1321 is consistent with a thickness direction of the latching member 131, and the latching member 131 is rotatable relative to the computer case 11 along an axis corresponding to the thickness direction of the latching member 131.

In an embodiment, as shown in FIGS. 7 to 13, the assembly base 132 has a strip shape. Both ends of the assembly base 132 in a length direction thereof are connected to the computer case 11, and the mounting gap 1321 is formed between a middle portion of the assembly base 132 and the frame 113. The latching member 131 is hinged to the middle portion of the assembly base 132.

As shown in FIG. 1 to FIG. 3, the assembly base 132 is located in the front window 112 and connected to the frame 113. A part of the frame 113 is located above the latching member 131, so that the GPU assembly 12 cannot move upward relative to the computer case 11 after the latching member 131 is inserted into the locking member 1221.

Further, in some embodiments, as shown in FIGS. 7 to 13, the locking assembly 13 further includes a sliding bracket 133. As shown in FIG. 1 and FIG. 2, the sliding bracket 133 is capable of sliding relative to the computer case 11 in a first direction. A part of the sliding bracket 133 is located outside the computer case 11, and the other part of the sliding bracket 133 is located in the mounting gap 1321 and cooperates with the latching member 131, such that the latching member 131 can switch between the locking state and the unlocking state when the sliding bracket 133 slides relative to the computer case 11 along the first direction.

Specifically, the sliding bracket 133 includes an operation portion 1333 and a sliding limiting portion 1331 connected to the operation portion 1333. The operation portion 1333 is located outside the computer case 11, and the sliding limiting portion 1331 is located in the mounting gap 1321. The operation portion 1333 is configured to be operated by the user, so as to improve the convenience of operation. When the sliding bracket 133 slides in the first direction relative to the computer case 11, the sliding limiting portion 1331 slides in the mounting gap 1321.

In one embodiment, a length direction of the assembly base 132 is the first direction, a length direction of the mounting gap 1321 is the first direction, and the sliding limiting portion 1331 is configured to slide back and forth in the mounting gap 1321 along the first direction.

The sliding limiting portion 1331 can be directly engaged with the latching member 131 or indirectly engaged with the latching member 131 through a transmission unit, as long as the sliding of the sliding bracket 133 can be converted into the rotation of the latching member 131. Moreover, the first direction may also intersect or be parallel to the front-rear direction of the computer case 11.

In an embodiment, as shown in FIG. 1 and FIG. 2, the first direction is perpendicular to the front-rear direction of the computer case 11, and the first direction is shown by an arrow L2. As shown in FIG. 7, FIG. 8, FIG. 10 to FIG. 13, the sliding bracket 133 is provided with a guiding groove 1332. For example, the guiding groove 1332 is provided in the sliding limiting portion 1331. The guiding groove 1332 extends along the front-rear direction of the computer case 11. The latching member 131 is provided with a locking post 1311 sliding in the guiding groove 1332. An axis of the locking post 1311 is parallel to a rotation axis of the latching member 131 relative to the computer case 11, and the axis of the locking post 1311 is misaligned with the rotation axis of the latching member 131.

As shown in FIG. 7 and FIG. 8, when the sliding bracket 133 slides relative to the computer case 11 along the first direction, the sliding limiting portion 1331 slides in the mounting gap 1321, the guiding groove 1332 moves relative to the assembly base 132 in the first direction. The locking post 1311 in the guiding groove 1332 slides with the guiding groove 1332 relative to the assembly base 132, and then the latching member 131 rotates relative to the assembly base 132 to switch between the locking state and the unlocking state.

Further, as shown in FIG. 9 to FIG. 13, in some embodiments, the assembly base 132 is provided with an anti-sliding member 1322, the sliding bracket 133 is provided with an anti-sliding groove 1335, the anti-sliding member 1322 is inserted into the anti-sliding groove 1335. When the sliding bracket 133 slides relative to the computer case 11 along the first direction, the anti-sliding member 1322 slides in the anti-sliding groove 1335 along the first direction.

When the anti-sliding member 1322 slides in the anti-sliding groove 1335 along the first direction to abut against one end of the anti-sliding groove 1335, the latching member 131 is in the locking state, and the anti-sliding member 1322 cannot continue to slide in the first direction relative to the sliding bracket 133, so as to ensure that the latching member 131 is in the locking state.

When the anti-sliding member 1322 slides sin the anti-sliding groove 1335 along a second direction opposite to the first direction to abut against the other end of the anti-sliding groove 1335, the latching member 131 is in the unlocking state, and the anti-sliding member 1322 cannot continue to slide reversely along the first direction relative to the sliding bracket 133, so as to ensure that the latching member 131 is in the unlocking state.

Specifically, in an embodiment, as shown in FIGS. 9 to 13, the sliding groove 1335 is formed in the operation portion 1333. A length direction of the assembly base 132 is the first direction, and the anti-sliding member 1322 is provided at a middle portion of the assembly base 132.

Figure 11:
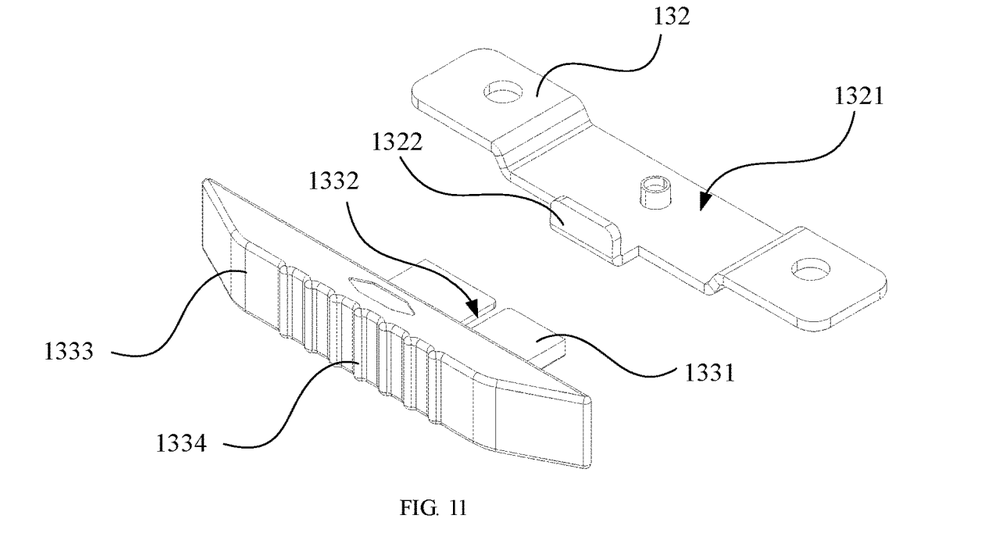
FIG. 11 is an exploded view of the locking assembly of FIG. 10.
Figure 12:
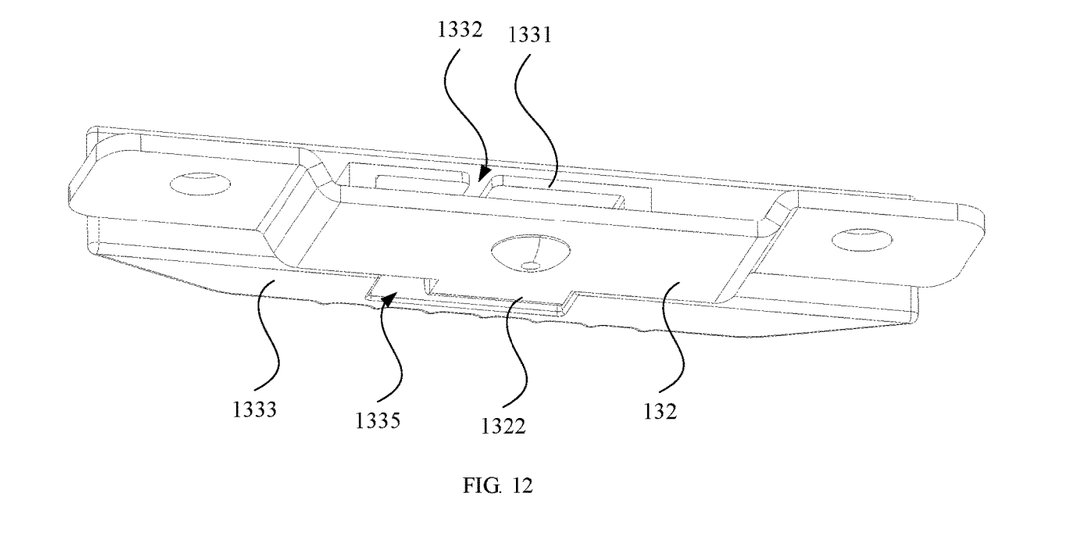
FIG. 12 is a perspective view of the locking assembly after removing a latching member viewed from another aspect.
Figure 13:
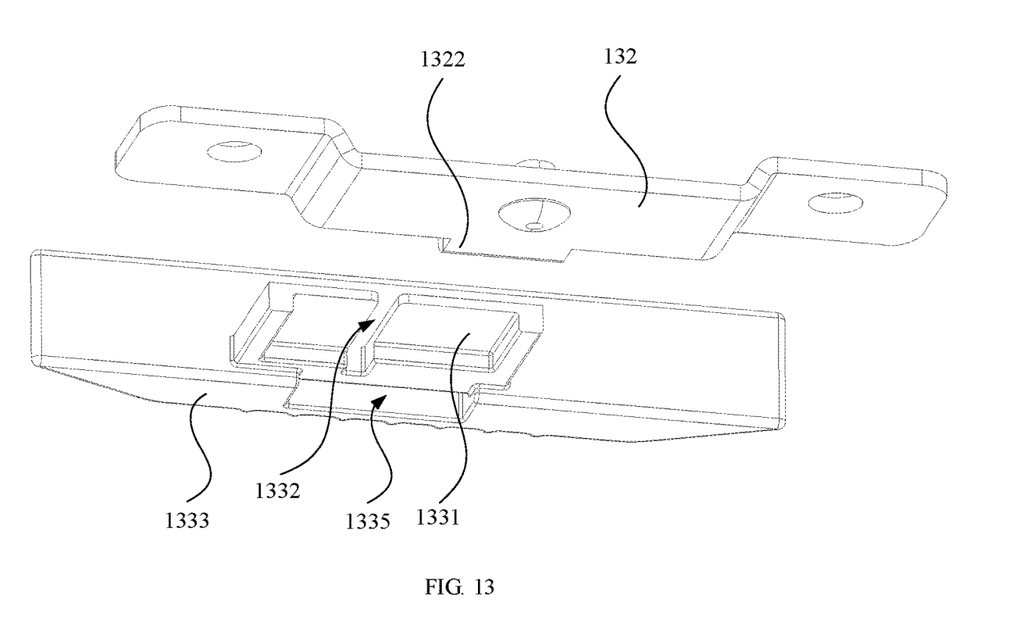
FIG. 13 is an exploded view of the locking assembly of FIG. 12.

As shown in FIG. 11 to FIG. 13, the anti-sliding member 1322 is inserted into the operation portion 1333 along a thickness direction of the mounting gap 1321.

In an embodiment, the sliding groove 1335 may also be formed on other parts of the sliding bracket 133, which is not limited herein.

As shown in FIG. 9 to FIG. 13, the operation portion 1333 is provided with an anti-sliding texture 1334. As shown in FIG. 1 and FIG. 2, the operation portion 1333 is located in front of the computer case 11 for easy access.

Further, as shown in FIG. 1 to FIG. 5, in some embodiments, the GPU assembly 12 further includes a decorative plate 123 covering at an outer side of the module bracket 122, and the locking member 1221 is located adjacent to an inner side of the decorative plate 123.

As shown in FIG. 1 and FIG. 2, when the GPU assembly 12 is mounted in the computer case 11, the decorative plate 123 covers the locking member 1221, so that the server 10 has a good appearance.

In some embodiments, as shown in FIG. 1 and FIG. 2, the server 10 further includes a corner locking member 14, an end of the GPU assembly 12 away from the front window 112 is connected to the corner locking member 14. The corner locking member 14 is rotatable and is capable of switching between a locking state and an unlocking state. The corner locking member 14 in the locking state is locked to the computer case 11, and the corner locking member 14 in the unlocking state is separated from the computer case 11.

An end of the GPU assembly 12 adjacent to the front window 112 is detachably mounted on the front window 112 through the locking assembly 13, and the end of the GPU assembly 12 away from the front window 112 is detachably connected to the computer case 11 through the corner locking member 14.

The above-mentioned embodiments do not constitute a limitation on the protection scope of the technical solution. Any modifications, equivalent replacements and improvements made within the spirit and principles of the above-mentioned embodiments shall be included within the protection scope of this technical solution.

The foregoing descriptions are merely specific embodiments of the present invention, but are not intended to limit the protection scope of the present invention. Any variation or replacement readily figured out by a person skilled in the art within the technical scope disclosed in the present invention shall all fall within the protection scope of the present invention.

What is claimed is:

1. A server, comprising:
a computer case comprising a front window;
a GPU assembly mounted in the computer case, the GPU assembly comprising a module bracket, and an end of the GPU assembly being located at the front window; and
a locking assembly comprising a latching member, the latching member being rotatably mounted at the front window and being capable of switching between an unlocking state and a locking state, the module bracket being provided with a locking member corresponding to the latching member, wherein in the locking state, the latching member is at least partially inserted into the locking member to limit the GPU assembly in the computer case, and in the unlocking state, the latching member is disengaged from the locking member;
wherein the latching member is inserted into the locking member in a direction parallel to a front-rear direction of the computer case;
wherein the locking assembly further comprises a pin, the computer case comprises a frame forming the front window, a part of the module bracket is in contact with the frame, the pin is inserted into the module bracket and the frame in a direction intersected with the front-rear direction of the computer case.

2. The server according to claim 1, wherein the locking assembly further comprises an assembly base, the assembly base is connected to the frame, a part of the assembly base is spaced apart from the frame to form a mounting gap, the latching member is mounted in the mounting gap, the latching member is hinged to the assembly base, the latching member is capable of rotating in the mounting gap relative to the assembly base to switch between the unlocking state and the locking state.

3. The server according to claim 2, wherein the locking assembly further comprises a sliding bracket, the sliding bracket is capable of sliding relative to the computer case in a first direction, a part of the sliding bracket is located outside the computer case, and another part of the sliding bracket is located in the mounting gap and cooperates with the latching member, the latching member is capable of switching between the locking state and the unlocking state when the sliding bracket slides along the first direction relative to the computer case.

4. The server according to claim 3, wherein the first direction is perpendicular to the front-rear direction of the computer case, the sliding bracket comprises a sliding limiting portion located in the mounting gap, the sliding limiting portion is provided with a guiding groove extending along the front-rear direction of the computer case, the latching member is provided with a locking post capable of sliding in the guiding groove, an axis of the locking post is parallel to a rotation axis of the latching member relative to the computer case, and the axis of the locking post is misaligned with the rotation axis of the latching member.

5. The server according to claim 3, wherein the assembly base is provided with an anti-sliding member, the sliding bracket is provided with an anti-sliding groove, the anti-sliding member is inserted into the anti-sliding groove, and when the sliding bracket slides in the first direction relative to the computer case, the anti-sliding member slides in the anti-sliding groove in the first direction;
when the anti-sliding member slides in the anti-sliding groove along the first direction to abut against one end of the anti-sliding groove, the latching member is in the locking state;
when the anti-sliding member slides in the anti-sliding groove along a second direction opposite to the first direction to abut against the other end of the anti-sliding groove, the latching member is in the unlocking state.

6. The server according to claim 5, wherein the sliding bracket comprises an operation portion located outside the computer case, the sliding groove is formed in the operation portion, the assembly base has a strip shape extending in the first direction, both ends of the assembly base are connected to the computer case, the mounting gap is formed between a middle portion of the assembly base and the frame, and the anti-sliding member is connected to the middle portion of the assembly base.

7. The server according to claim 6, wherein the operation portion is located in front of the computer case, and the operation portion is provided with an anti-sliding texture.

8. The server according to claim 1, wherein the GPU assembly further comprises a decorative plate covering an outer side of the module bracket, and the locking member is located adjacent to an inner side of the decorative plate.

9. A server, comprising:
- a computer case comprising a front window;
- a GPU assembly mounted in the computer case, the GPU assembly comprising a module bracket, and an end of the GPU assembly being located at the front window;
- a locking assembly comprising a latching member, the latching member being rotatably mounted at the front window and being capable of switching between an unlocking state and a locking state, the module bracket being provided with a locking member corresponding to the latching member, wherein in the locking state, the latching member is at least partially inserted into the locking member to limit the GPU assembly in the computer case, and in the unlocking state, the latching member is disengaged from the locking member; and
- a corner locking member, wherein an end of the GPU assembly away from the front window is connected to the corner locking member, the corner locking member is capable of switching between a locking state and an unlocking state, the corner locking member in the locking state is locked to the computer case, the corner locking member in the unlocking state is separated from the computer case.

* * * * *